(12) United States Patent
Yi et al.

(10) Patent No.: US 9,324,888 B2
(45) Date of Patent: Apr. 26, 2016

(54) SOLAR CELL AND METHOD FOR MANUFACTURING SAME

(75) Inventors: Gyuchul Yi, Seoul (KR); Jaehyeok Heo, Seogwipo-si (KR); Yongjin Kim, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 258 days.

(21) Appl. No.: 13/881,470

(22) PCT Filed: Oct. 25, 2011

(86) PCT No.: PCT/KR2011/007995
§ 371 (c)(1),
(2), (4) Date: Apr. 25, 2013

(87) PCT Pub. No.: WO2012/057506
PCT Pub. Date: May 3, 2012

(65) Prior Publication Data
US 2013/0213463 A1 Aug. 22, 2013

(30) Foreign Application Priority Data
Oct. 25, 2010 (KR) ........................ 10-2010-0103911

(51) Int. Cl.
| H01L 31/00 | (2006.01) |
| H01L 21/00 | (2006.01) |
| H01L 31/0236 | (2006.01) |
| H01L 31/0224 | (2006.01) |
| H01L 31/0352 | (2006.01) |
| H01L 31/0392 | (2006.01) |
| H01L 31/07 | (2012.01) |
| H01L 31/072 | (2012.01) |
| H01L 31/073 | (2012.01) |
| H01L 31/0735 | (2012.01) |
| H01L 31/075 | (2012.01) |
| H01L 31/18 | (2006.01) |

(52) U.S. Cl.
CPC .. *H01L 31/02366* (2013.01); *H01L 31/022425* (2013.01); *H01L 31/0392* (2013.01); *H01L 31/03529* (2013.01); *H01L 31/035227* (2013.01); *H01L 31/07* (2013.01); *H01L 31/072* (2013.01); *H01L 31/073* (2013.01); *H01L 31/075* (2013.01); *H01L 31/0735* (2013.01); *H01L 31/1892* (2013.01); *Y02E 10/543* (2013.01); *Y02E 10/544* (2013.01); *Y02E 10/548* (2013.01)

(58) Field of Classification Search
None
See application file for complete search history.

(56) References Cited

U.S. PATENT DOCUMENTS

| 2008/0220553 A1* | 9/2008 | Park et al. ................. 438/30 |
| 2010/0012190 A1* | 1/2010 | Goto et al. ................. 136/261 |
| 2011/0030772 A1* | 2/2011 | Veerasamy ................. 136/256 |

FOREIGN PATENT DOCUMENTS

| JP | 2010-028092 A | 2/2010 |
| KR | 10-0809248 B1 | 2/2008 |

OTHER PUBLICATIONS

Dufaux et al., "Photocurrent Distribution in Graphene-CdS Nanowire Devices," *Small Journal*, 6(16): 1868-1872 (Aug. 3, 2010).
Korean Intellectual Property Office, International Search Report in International Patent Application No. PCT/KR2011/007995 (May 24, 2012).

* cited by examiner

*Primary Examiner* — Eli Mekhlin
(74) *Attorney, Agent, or Firm* — The PL Law Group, PLLC (57) ABSTRACT

The invention relates to a solar cell and to a method for manufacturing same. The solar cell contains a carbon structure layer; a microstructure formed on the carbon structure layer; and a thin-film layer covering the microstructure and including a charge separation junction part.

21 Claims, 10 Drawing Sheets

SOLAR CELL AND METHOD FOR MANUFACTURING SAME

TECHNICAL FIELD

The present invention relates to a solar cell in which a thin-film including microstructures is formed on a carbon structure layer.

BACKGROUND ART

Lately, due to serious environmental pollution and exhaustion of fossil energy, importance of next-generation clean energy development is increasing. Among clean energy developed so far, solar cells are expected as future energy sources since the solar cell can be used semipermanently without causing environmental pollution, and solar energy resources are limitless.

A solar cell is a device for converting sunlight into electricity. However, since a thin film solar cell has low competiveness in view of cost, efficiency, etc., it is not widely used.

A representative cause of limiting the efficiency of the solar cell is the structural defect of its composition. That is, when photo-induced carriers, electrons, and holes are trapped and recombined by point defects, dislocation, stacking faults, grain boundaries, etc. in a thin film solar cell, the efficiency of the thin film solar cell becomes limited. Accordingly, if a material without such structural defects is used to manufacture a solar cell, the diffusion distances of carriers, electrons, and holes will increase, which contributes to improvement of the efficiency of a solar cell.

Accordingly, in order to overcome the above problem, a high-efficiency solar cell is needed which can be formed on a large-sized substrate having various properties, at low cost, by a simple manufacturing method.

DISCLOSURE

Technical Problem

The present invention provides a solar cell including a carbon structure layer, more specifically, a solar cell in which a thin-film layer including microstructures is formed on a carbon structure layer.

However, objects of the present invention are not limited to the above description, and other objects, although not described above, will be clearly understood by one of ordinary skill in the art from the following description.

Technical Solution

In order to achieve the object of the present invention, according to an aspect of the present invention, there is provided a solar cell including: a carbon structure layer; microstructures formed on the carbon structure layer; and a thin-film layer covering the microstructures and including a charge separation junction part.

According to another aspect of the present invention, there is provided a method for manufacturing a solar cell including: preparing a carbon structure layer; growing microstructures on the carbon structure layer; and forming a thin-film layer by covering the microstructures with a thin-film forming material.

Advantageous Effects

Therefore, by using a carbon structure layer, a high-efficiency solar cell having excellent electrical and optical properties can be provided. In more detail, by using, as a seed layer, microstructures having excellent electrical and optical properties as well as excellent crystallizability, it is possible to easily grow a high-quality thin-film layer on a carbon structure layer.

Also, since the carbon structure layer of the solar cell can function as an electrode as well as a substrate, and can be easily transferred onto another low-cost substrate, the manufacturing cost of the solar cell can be reduced.

BEST MODE FOR CARRYING OUT THE INVENTION

Hereinafter, example embodiments of the present invention will be described in detail so that one of ordinary skill in the art can easily implement the prevent invention.

However, example embodiments of the present invention may be embodied in many alternate forms and should not be construed as limited to example embodiments of the present invention set forth herein. Also, to help understand the present invention, some components are not described and are not shown in the appended drawings. The like numbers refer to like elements throughout this specification.

It will be further understood that the terms "comprises", "comprising", "includes" and/or "including", when used herein, specify the presence of stated components, but do not preclude the presence or addition of one or more other components.

The terms regarding degrees used in this specification, for example, "about", "substantially", etc. should be construed as including the proposed fabrication and material deviation, and are used to prevent unconscientious infringers from illegally using content disclosed as accurate or absolute values for helping understanding of the present invention.

The term "graphene" used in this specification means a layer or sheet formed of graphene which is a polycyclic aromatic molecule configured with a plurality of carbon atoms coupled by covalent binding, wherein the carbon atoms form a six-membered ring as a molecule unit; however, the carbon atoms may form a five-membered ring and/or a seven-membered ring. Accordingly, the graphene is considered as a single layer of carbon atoms subject to covalent binding (generally, $sp^2$-bonding). The graphene may have various structures depending on the content of five-membered rings and/or seven-membered rings that can be contained in the graphene. The graphene may be a single layer as described above, or a plurality of layers formed by stacking a plurality of layers of graphene. Generally, the side end portions of the graphene may be saturated with hydrogen atoms.

According to the present invention, by using a graphene layer as a carbon structure layer, the physical/chemical properties of a solar cell are significantly improved for the following reasons:

First, graphene has excellent electrical conductivity. Accordingly, graphene can be itself used as an electrode, and shows low contact resistance with respect to other electrodes. If graphene itself is used as an electrode, the entire structure is simplified compared to using a separate electrode, which results in the saving of process cost and time. Also, graphene has high chemical and mechanical stability, and particularly has flexibility and ductility. Furthermore, graphene can be manufactured to be transparent.

A solar cell according to an aspect of the present invention includes a carbon structure layer; microstructures formed on the carbon structure layer; and a thin-film layer covering the microstructures.

According to an exemplary embodiment, the solar cell may further include a first electrode layer formed on the thin-film layer; however, the solar cell is not limited to this embodiment.

According to an exemplary embodiment, the solar cell may further include a second electrode layer formed on the surface of the carbon structure layer; however, the solar cell is not limited to this embodiment. The first electrode layer and/or the second electrode layer may be formed of any conductive material that can be generally used as an electrode by one of ordinary skill in the art. For example, the first electrode layer and/or the second electrode layer may be formed of a metal, transparent conductive oxide (TCO) (for example, indium tin oxide (ITO), indium zinc oxide (IZO), aluminum zinc oxide (AZO), indium zinc tin oxide (IZTO), etc.), conductive polymer, graphene, or graphite, etc. For example, the metal may be Ag, Au, Ni, Ti, Cr, etc.

According to an exemplary embodiment, the carbon structure layer may include graphene or graphite; however, the carbon structure layer is not limited to these embodiments. Also, according to an exemplary embodiment, the graphene may be a single layer or a plurality of layers; however, the graphene is not limited to these embodiments.

According to an exemplary embodiment, the solar cell may further include a substrate below the carbon structure layer; however, the solar cell is not limited to this embodiment. According to an exemplary embodiment, the carbon structure layer may include any material that can be easily separated from the substrate and easily transferred onto a target substrate. The substrate may be formed of any material, such as a metal, glass, resin, etc. According to an exemplary embodiment, the substrate may be formed of silicon, silicon carbide, gallium arsenide, spinel, indium phosphide, gallium phosphide, aluminum phosphide, gallium nitride, indium nitride, aluminum nitride, zinc oxide, magnesium oxide, aluminum oxide, titanium oxide, sapphire, quartz, or pyrex; however, the material for forming the substrate is not limited to the above-mentioned materials.

According to an exemplary embodiment, the carbon structure layer may be an electrode of the solar cell; however, the carbon structure layer is not limited to this. For example, the carbon structure layer may function as a substrate as well as an electrode.

According to an exemplary embodiment, the microstructures may function as a seed layer on which the thin-film layer can be grown; however, the function of the microstructures is not limited to this.

According to an exemplary embodiment, damages may be formed on a part of the carbon structure layer, and the microstructures may be formed on the damages of the carbon structure layer.

According to an exemplary embodiment, the thin-film layer may be a single layer or a plurality of layers; however, the thin-film layer is not limited to these embodiments. According to an exemplary embodiment, the charge separation junction part included in the thin-film layer may be formed on the interface between the microstructures and the thin-film layer or on the individual interfaces of the plurality of thin-film layers.

According to an exemplary embodiment, the microstructures may be selected from the group consisting of a microbar, a micro-needle, a micro-tube, a micro-wall, and their combinations; however, the shape of the microstructures is not limited to these embodiments. For example, the section of the microstructures may be one of various geometrical shapes, such as a polygon (for example, a circle, a triangle, a quadrangle, a pentagon, a hexagon, a heptagon, an octagon, a nonagon, a decagon, a trapezoid, a rhombus, a parallelogram, etc.), a complex figure (for example, an ellipse, a half-moon shape, a crescent-moon shape, a flower shape, a star shape, etc.), a linear trench, a curved trench, etc.; however, the section of the microstructures is not limited to these embodiments.

According to an exemplary embodiment, the microstructures may be formed of at least one of a metal and a semiconductor; however, the material for forming the microstructures is not limited to these. According to an exemplary embodiment, the metal may be selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. According to an exemplary embodiment, the semiconductor may be a semiconductor based on an oxide, a nitride, a carbide, a III-V group compound, a II-VI group compound, or silicon; however, the semiconductor is not limited to the above-mentioned materials. In more detail, the microstructures may contain at least one material selected from the group consisting of silicon, zinc oxide, zinc magnesium oxide, zinc cadmium oxide, zinc magnesium cadmium oxide, zinc beryllium oxide, zinc magnesium beryllium oxide, zinc manganese oxide, zinc magnesium manganese oxide, gallium oxide, aluminum oxide, gallium aluminum nitride, and indium gallium nitride; however, the material for forming the microstructures is not limited to the above-mentioned materials.

According to an exemplary embodiment, the thin-film layer may be formed of at least one of a metal and a semiconductor; however, the material for forming the microstructures is not limited to these. According to an exemplary embodiment, the metal may be selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. According to an exemplary embodiment, the semiconductor may be a semiconductor based on an oxide, a nitride, a carbide, a III-V group compound, a II-VI group compound, or silicon; however, the semiconductor is not limited to the above-mentioned materials.

According to another aspect of the present invention, a method of manufacturing a solar cell, includes: preparing a carbon structure layer; growing microstructures on the carbon structure layer; and forming a thin-film layer by covering the microstructures with a thin-film forming material. According to an exemplary embodiment, the thin-film layer may include a charge separation junction part.

The method of manufacturing a solar cell may further include forming a first electrode layer on the thin-film layer; however, the method of manufacturing a solar cell is not limited to this.

The method of manufacturing a solar cell may further include forming a second electrode layer on the surface of the carbon structure layer; however, the method of manufacturing a solar cell is not limited to this.

According to an exemplary embodiment, the method of preparing the carbon structure layer may include forming the carbon structure layer on a substrate; however, the method of preparing the carbon structure layer is not limited to this. According to an exemplary embodiment, the method of preparing the carbon structure layer may include transferring a carbon structure layer formed on a substrate to a target substrate; however, the method of preparing the carbon structure layer is not limited to this.

According to an exemplary embodiment, the method of growing the microstructures on the carbon structure layer may include forming damages on the carbon structure layer and forming the microstructures on the damages; however, the method of growing the microstructures on the carbon structure layer is not limited to this. For example, the damages may be formed by a method selected from the group consisting of gas plasma, ion-beam, e-beam, proton beam, neutron beam, and their combinations.

According to an exemplary embodiment, the method of forming the damages may include forming a mask layer on the carbon structure layer; patterning the mask layer to form a plurality of openings; and forming the damages on the carbon structure layer through the openings; however, the method of forming the damages is not limited to this. According to an exemplary embodiment, the method of patterning the mask layer to form the plurality of openings may be performed by at least one method selected from among e-beam lithography, photolithography, laser interference lithography, nanoimprint, and template.

According to an exemplary embodiment, the locations of the microstructures may be controlled.

Hereinafter, a solar cell, and a method of manufacturing a solar cell, according to embodiments of the present invention, will be described in detail with reference to the appended drawings. However, the present invention is not limited to embodiments described below.

Figure 1:
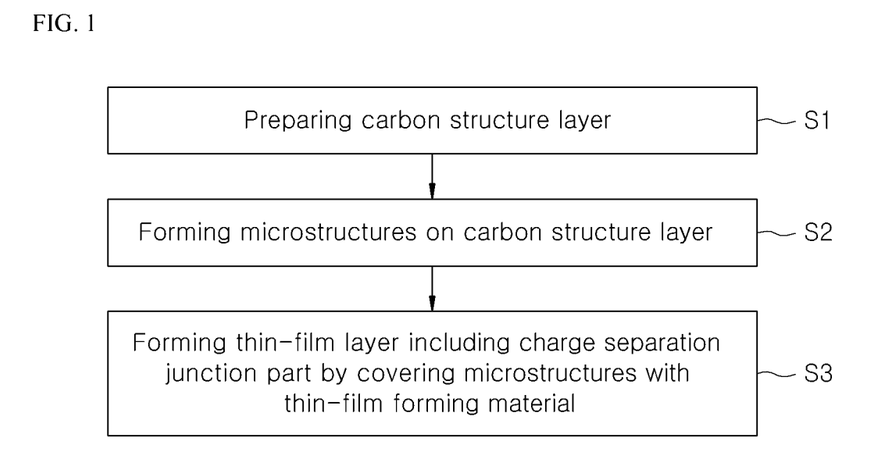
FIG. 1 is a flowchart showing a method for manufacturing a solar cell according to an embodiment of the present invention.
Figure 2A:
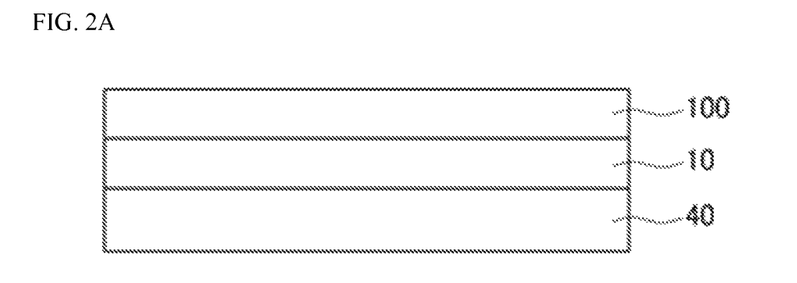
FIG. 2 is a process view for explaining the method for manufacturing a solar cell.
Figure 2B:
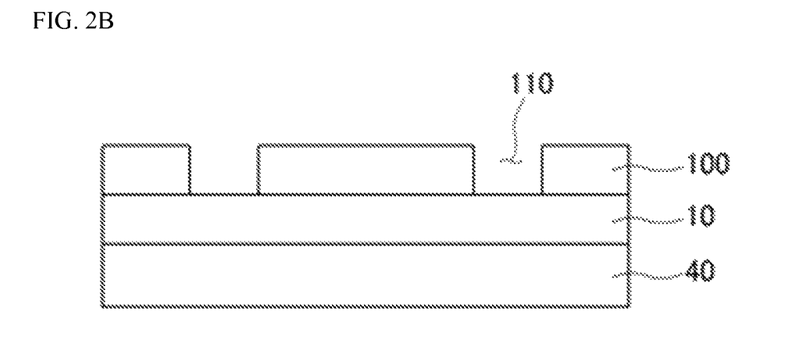
Figure 2C:
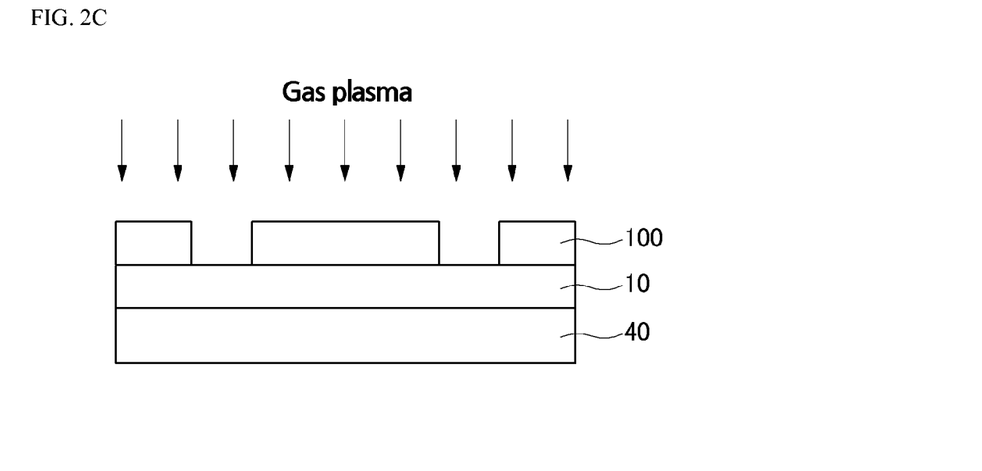
Figure 2D:
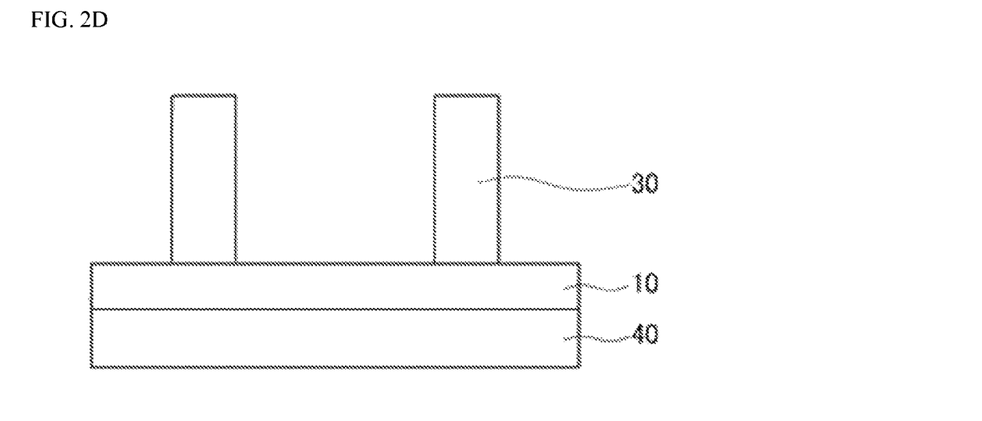
Figure 2E:
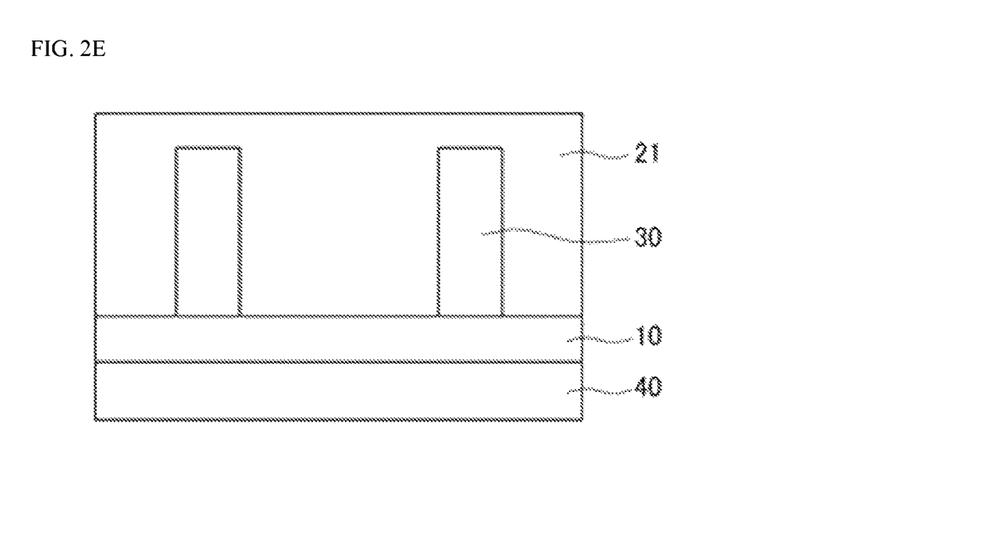
Figure 2F:
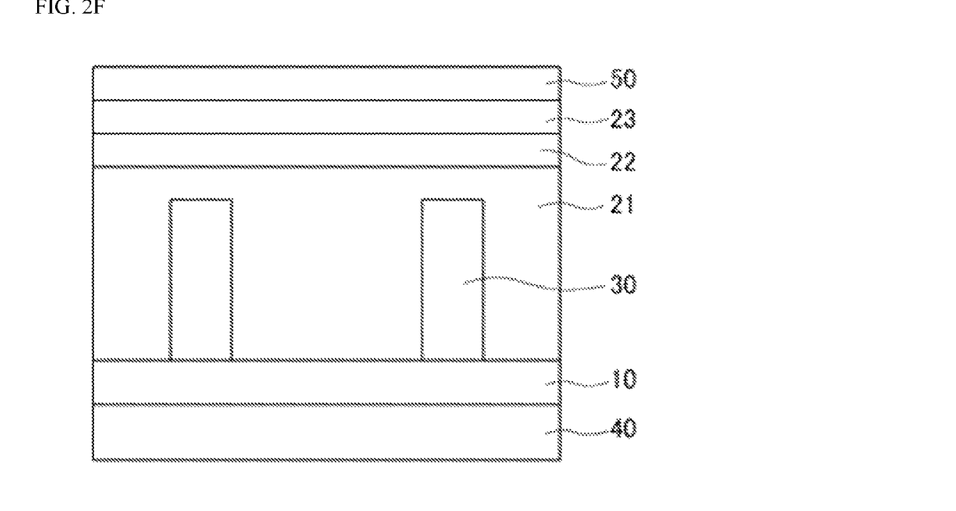

Referring to FIG. 1, the method of manufacturing a solar cell includes: preparing a carbon structure layer 10 (S1); growing microstructures 30 on the carbon structure layer 10 (S2); and forming a thin-film layer 20 including a charge separation junction part by covering the microstructures 30 with a thin-film forming material (S3). The carbon structure layer 10 may include graphene or graphite. Hereinafter, as an exemplary embodiment of the method of manufacturing a solar cell, a solar cell including a carbon structure layer will be described in more detail.

First, a carbon structure layer 10 is prepared (S1). The carbon structure layer 10 may be provided as it is, or as a carbon structure layer stacked on a substrate.

According to an exemplary embodiment, the carbon structure layer 10 may be formed on the substrate by chemical vapor deposition (CVD). CVD is a method that has been generally used by one of ordinary skill in the art to form a carbon structure layer. For example, CVD may include thermal chemical vapor deposition (T-CVD), rapid thermal chemical vapor deposition (RTCVD), plasma enhanced chemical vapor deposition (PECVD), inductively coupled plasma chemical vapor deposition (ICPCVD), metal organic chemical vapor deposition (MOCVD), low pressure chemical vapor deposition (LPCVD), or atmospheric pressure chemical vapor deposition (APCVD); however, the CVD is not limited to the above-mentioned methods. As another exemplary embodiment of forming a carbon structure layer, graphene may be formed by mechanical exfoliation or chemical exfoliation of graphite.

Successively, the microstructures 30 are grown on the carbon structure layer 10 (S2). Since the surface of a carbon structure layer, for example, graphene is chemically very stable and has very low reactivity, it is very difficult to uniformly grow a thin-film layer on the graphene. In the present invention, in order to overcome the problem, microstructures 30 are formed on a carbon structure layer, and a thin-film layer is grown using the microstructures 30 as a kind of seed.

The microstructures 30 may be formed at any locations on the carbon structure layer 10. The microstructures 30, which are micro- or nano-scale structures, have no specific limitation in size or shape. The microstructures 30 may be grown on the carbon structure layer 10. However, this does not mean that an angle formed by the microstructures 30 and the carbon structure layer 10 is necessarily 90 degrees. The carbon structure layer 10 is formed by a bottom-up method in which the micro-structures 30 are stacked upward with respect to the plate surface of the carbon structure layer 10, from a part in contact with the carbon layer 10 as the starting point.

The microstructures 30 fabricated by the bottom-up method can be grown as excellent crystalline structures having very low dislocation density in spite of the differences in material constants (lattice constant, thermal expansion coefficient etc.) with respect to the substrate. Accordingly, the microstructures 30 have a better crystallizability than structures fabricated by a top-down method based on etching. Thus the bottom-up method results in improvement of electrical properties, which contributes to the manufacture of a high-efficiency solar cell.

As an exemplary embodiment for forming the microstructures 30 on the carbon structure layer 10, damages may be formed on the carbon structure layer 10, and microstructures 30 may be formed on the damages. A method of forming damages on a carbon structure layer is to artificially damage the carbon structure layer by any method that has been generally used by one of ordinary skill in the art. For example, the method may include gas plasma, ion-beam, e-beam, proton beam, neutron beam, etc. The damages functions as a site of nucleation and growth on the carbon structure layer 10. Any method capable of adjusting the locations of damages, among the above-mentioned methods, can adjust the locations and density of the microstructures 30 without using a mask layer which will be described later.

A method of growing the microstructures 30 on the carbon structure layer 10 on which the damages have been formed includes chemical CVD including metal organic CVD (MOCVD), physical growth, such as sputtering, thermal or electron beamevaporation, pulse laser deposition, etc., a vapor-phase transport process using a metal catalyst such as gold, and so on. CVD is a method that has been generally used by one of ordinary skill in the art to form a carbon structure layer. For example, the CVD may include thermal chemical vapor deposition (T-CVD), rapid thermal chemical vapor deposition (RTCVD), plasma enhanced chemical vapor deposition (PECVD), inductively coupled plasma chemical vapor deposition (ICPCVD), metal organic chemical vapor deposition (MOCVD), low pressure chemical vapor deposition (LPCVD), and atmospheric pressure chemical vapor deposition (APCVD); however, the CVD is not limited to the above-mentioned methods. If a catalyst-free MOCVD is used, the pollution due to catalysts can be prevented during the manufacture of microstructures with excellent electrical and optical performances.

Also, by adjusting the locations of the damages before the microstructures are grown on the carbon structure layer 10 so as to grow the microstructures 30 only on the damages, it is possible to control the locations of the microstructures 30 on the carbon structure layer 10.

According to a method of controlling the locations of the microstructures 30 on the carbon structure layer 10, a mask layer having one or more openings 110 can be deposited on the carbon structure layer 10 before growing the microstructures 30 on the carbon structure layer 10, the locations of the microstructures 30 may be controlled (see FIGS. 2A through 2F). A method of forming the openings 110 in the mask layer 100 may include e-beam lithography, photolithography, nanoimprint, nanosphere, anodized aluminum oxide (AAO), laser interference lithography, template, block copolymer, etc. By forming a regular pattern (openings 110) in the mask layer 100 using one of the above-mentioned methods, forming damages through the openings 110, and growing the microstructures 30 only on the damages, the locations of the microstructures 30 may be controlled. In the case in which the mask layer 100 is used, the method of removing the mask layer 100 after growing the microstructures 30 may be further performed. However, the method of removing the mask layer 100 is not necessarily required, and the mask layer 100 may remain as an insulating layer.

So far, a method of adjusting the locations and density of microstructures through patterning and/or creation of damages has been described; however, the method of growing microstructures is not limited to this. For example, it is possible to grow microstructures directly on a carbon structure layer by appropriately setting process conditions of temperature, pressure, etc.

Finally, the thin-film layer 20 is formed by covering the microstructures 30 on the graphene layer with a thin-film forming material. The thin-film layer 20 is formed to cover the microstructures 30. That is, the microstructures 30 and the thin-film layer 20 are formed such that the microstructures 30 are buried in the thin-film layer 20. Also, preferably, the thin-film layer 20 is formed of a substance whose crystalline structure and lattice constant are similar to those of the microstructures 30 for matching with the microstructures 30. The thin-film layer 20 may be a metal or a semiconductor. For example, the metal may be selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. Also, the semiconductor may be a semiconductor based on an oxide, a nitride, a carbide, a III-V group compound, a II-VI group compound, or silicon; however, the semiconductor is not limited to the above-mentioned materials.

The n-type semiconductor layer may be formed of a semiconductor material doped with n-type impurities. The n-type impurities may include silicon, germanium, selenium, tellurium, and carbon, and the semiconductor material may include indium nitride, gallium nitride, aluminum nitride, gallium aluminum nitride, and indium gallium nitride. However, the n-type impurities and the semiconductor material are not limited to the above-mentioned materials. Also, the p-type semiconductor layer may be formed of a semiconductor material doped with p-type impurities. The p-type impurities may include magnesium, zinc, and beryllium, and the semiconductor material may include indium nitride, gallium nitride, aluminum nitride, gallium aluminum nitride, and indium gallium nitride. However, the p-type impurities and the semiconductor material are not limited to the above-mentioned materials. For example, the thin-film layer may include a silicon semiconductor with n-type impurities that are group V elements, and p-type impurities that are group III elements.

Figure 3:
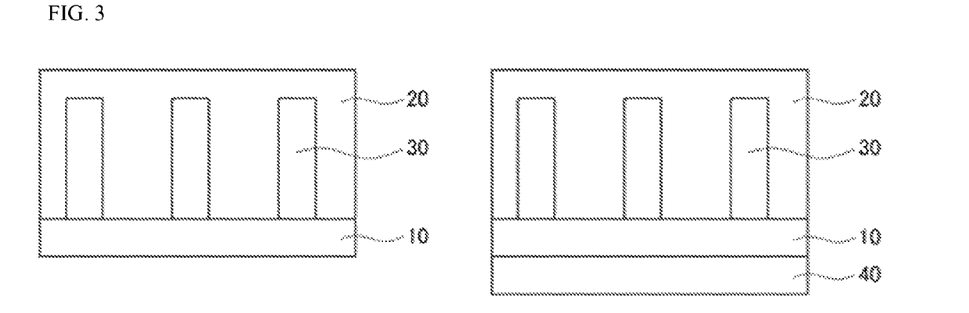
FIG. 3 is a cross-sectional view of a solar cell according to an embodiment of the present invention.
Figure 4:
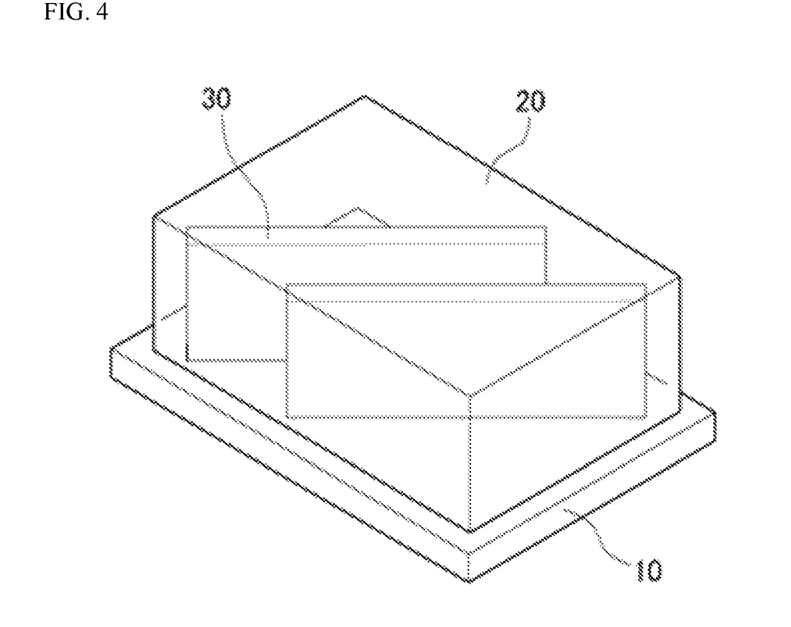
FIG. 4 is a perspective view of a solar cell according to an embodiment of the present invention.
Figure 5A:
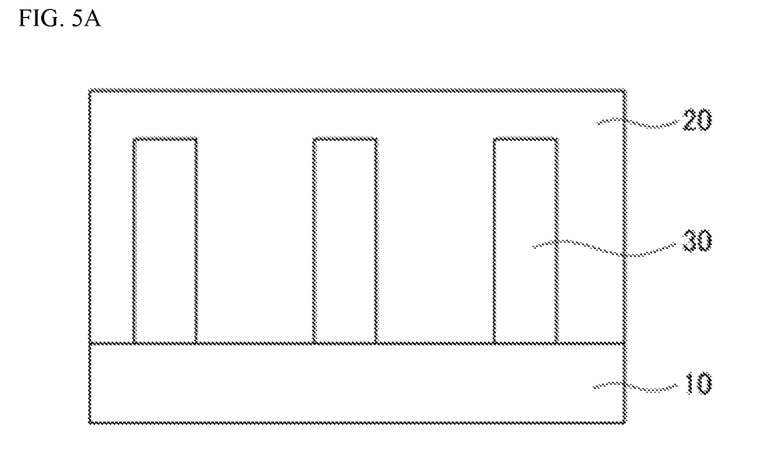
FIG. 5 is cross-sectional views showing microstructures of solar cells according to embodiments of the present invention.
Figure 5B:
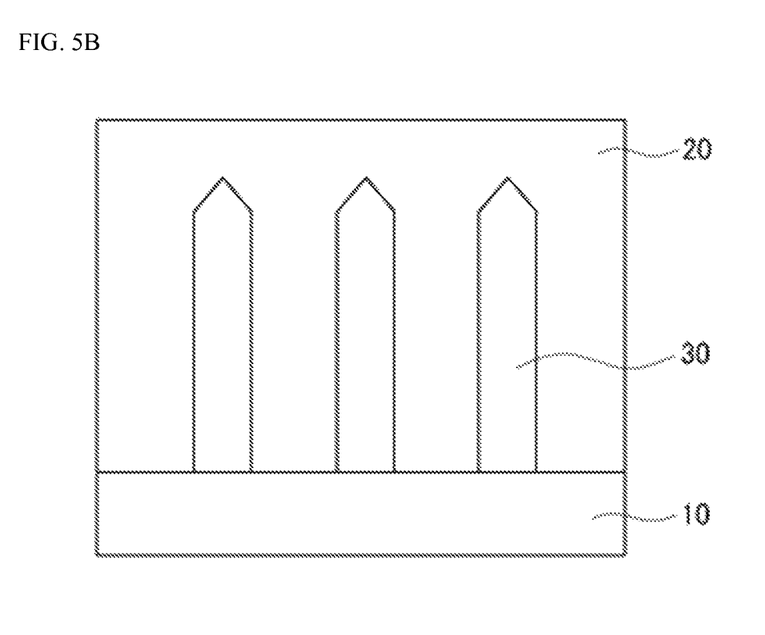
Figure 5C:
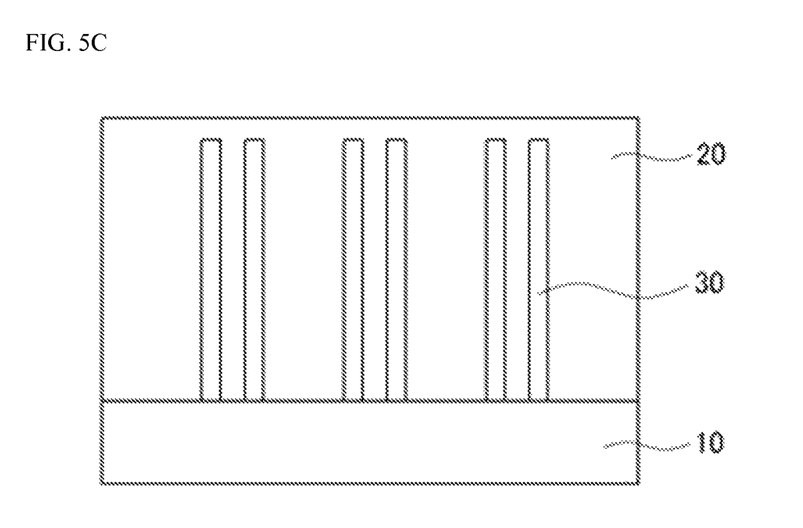
Figure 5D:
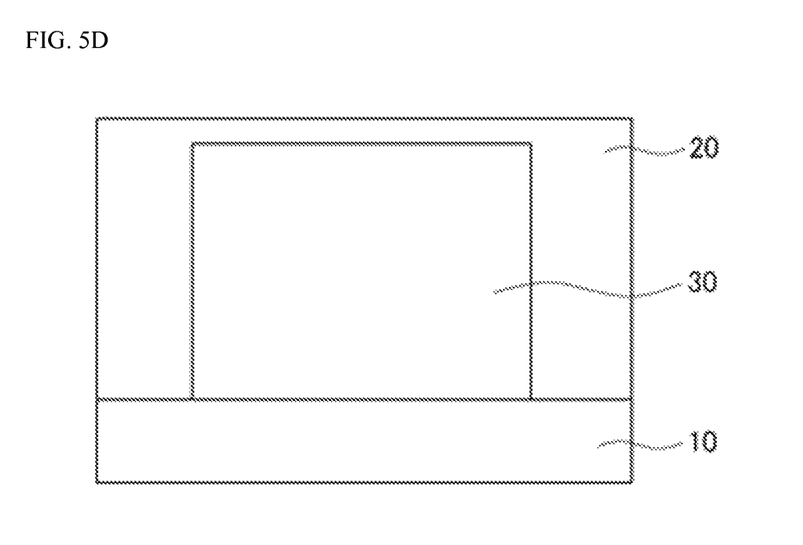

FIGS. 3 and 4 are a cross-sectional view and a perspective view showing the thin-film layer 20 on the carbon structure layer 10, formed by the above-described method. As shown in FIG. 3, the carbon structure layer 10 may be provided as it is, or as a carbon structure layer stacked on a substrate 40. However, if the carbon structure layer 10 has a sufficient mechanical strength, the substrate 40 may be omitted, and in this case, the carbon structure layer 10 may function as a substrate.

FIG. 5 is cross-sectional views of solar cells including thin-film layers with various shapes of microstructures 30. Referring to FIG. 5, the microstructures 30 may be in the shape of: micro-bars (a), micro-needles (b), micro-tubes (c), or a micro-wall (d).

Figure 6:
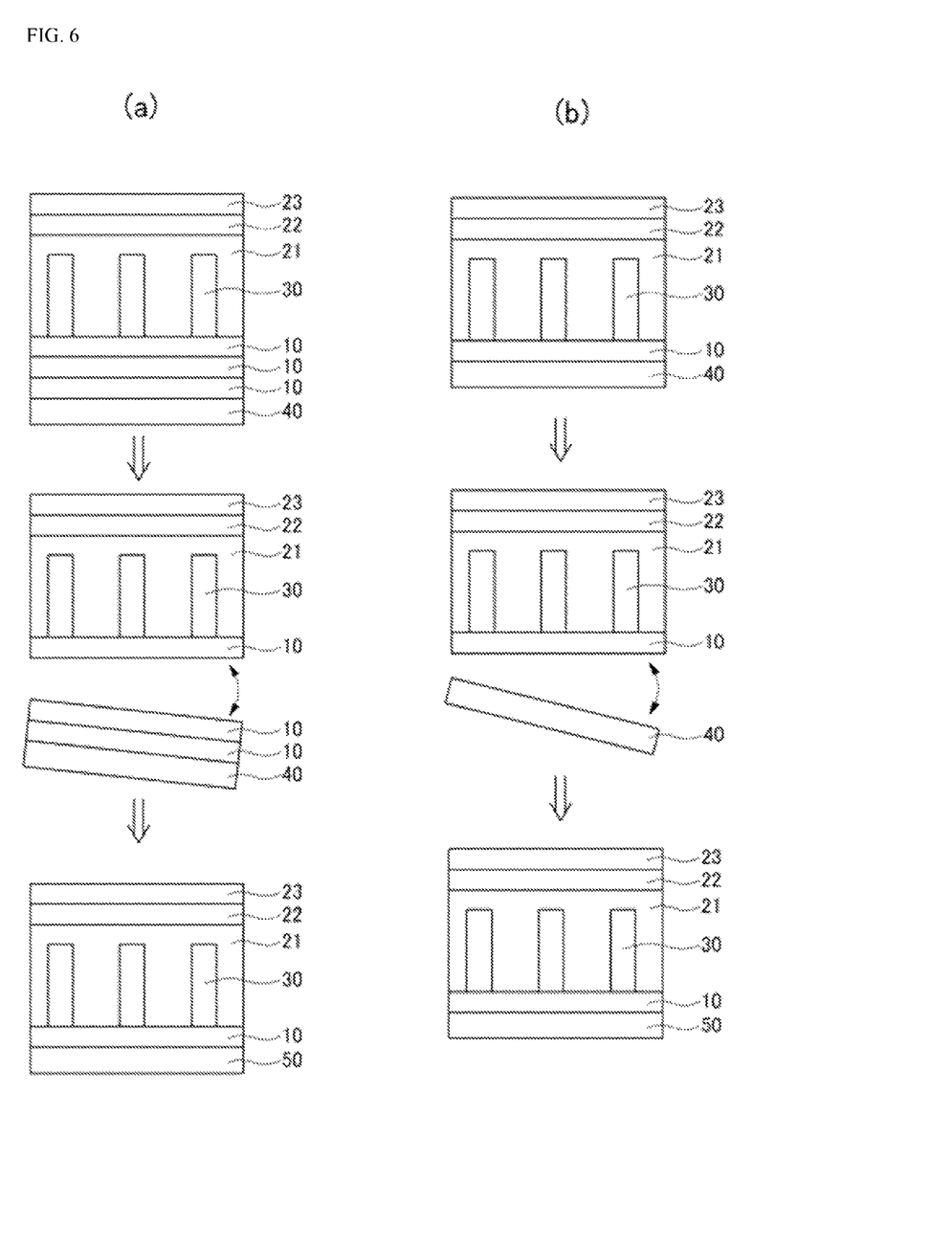
FIG. 6 is a view for explaining a method of transferring a solar cell, according to an embodiment of the present invention.

Referring to FIG. 6, a solar cell including a carbon structure layer 10 may be easily transferred onto a desired target substrate 50. According to an exemplary embodiment, when a single carbon structure layer 10(b) or a plurality of carbon structure layers 10(a) are formed, the carbon structure layers 10 may be separated from a substrate 40 on which the carbon structure layers 10 have been formed, and transferred onto the target substrate 50, for example, a flexible, deformable polymer substrate, a transparent substrate, a metallic substrate having excellent thermal conductivity, etc.

FIG. 6A shows the case of separating only a carbon structure layer among a plurality of carbon structure layers and transferring it onto a target substrate; however, it is also possible to separate a plurality of carbon structure layers and transfer them onto a target substrate. Particularly, since one or more carbon structure layers have a layered structure, the carbon structure layers may be easily separated from a substrate on which they have been formed, and transferred onto a low-cost substrate to be able to be used for manufacturing a solar cell. Also, when a plurality of carbon structure layers are formed, the entire carbon structure layers or a part of the carbon structure layers may be separated and transferred onto another target substrate.

As described above, a carbon structure layer, for example, graphene is easy to be separated from a substrate and transferred. That is, a carbon structure layer and structures thereon can be separated from a substrate therebeneath, and the separated carbon structure layer and structures thereon can be transferred onto another target substrate. The carbon structure layer can be separated from the substrate by a mechanical force, which is called mechanical lift-off.

General solar cells are manufactured on silicon substrates; however, silicon substrates are more expensive than plastic substrates, and also, it is difficult to separate silicon solar cells from silicon substrates and transfer the silicon solar cells. According to the present invention, by forming a solar cell including a carbon structure layer on a relatively low-cost substrate, or by transferring a solar cell including a carbon structure layer formed on a silicon substrate onto another low-cost substrate from the silicon substrate, the manufacturing cost of a solar cell can be reduced.

FIG. 7 is cross-sectional views showing charge separation junction parts of solar cells. A charge separation junction part may be configured differently according to the properties of microstructures or a charge separation layer. For example, the charge separation junction part may be a semiconductor p-n junction part, a semiconductor p-i-n junction part, a metal/semiconductor junction part, etc.; however, the charge separation junction part is not limited to these embodiments.

Figure 7A:
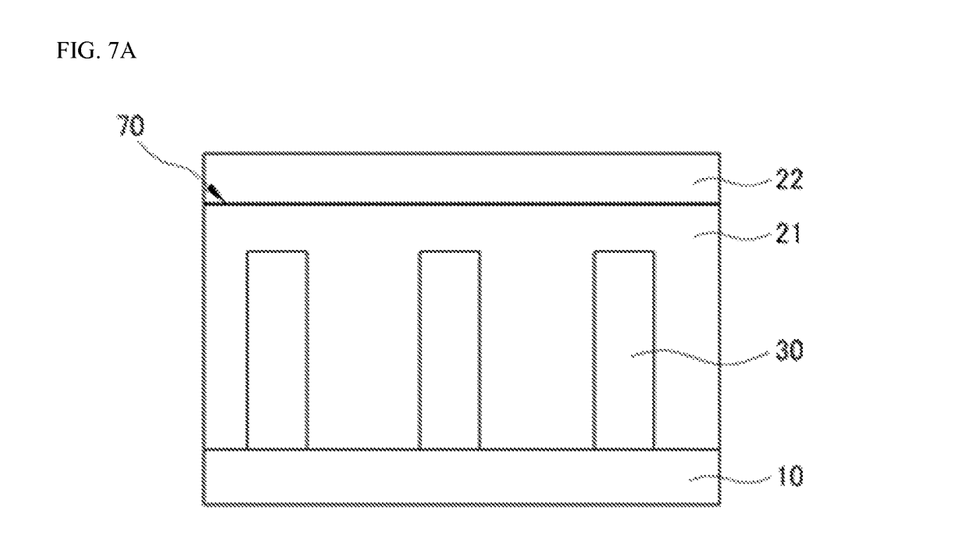
FIG. 7 is cross-sectional views showing charge separation junction parts of solar cells according to embodiments of the present invention.

For example, referring to FIG. 7A, in a solar cell according to an exemplary embodiment, a thin-film layer including microstructures is formed, wherein the thin-film layer includes a plurality of layers, for example, a first thin-film layer 21 and a second thin-film layer 22. In this case, a charge separation junction part 70 may be formed on the interface between the first thin-film layer 21 and the second thin-film layer 22. For example, the first thin-film layer 21 may be an n-type or p-type semiconductor, and the second thin-film layer 22 may be a p-type or n-type semiconductor; however, the first and second thin-film layers 21 and 22 are not limited to these. Preferably, the first thin-film layer 21 is an n-type semiconductor, and the second thin-film layer 22 is a p-type semiconductor.

The n-type semiconductor layer may be formed of a semiconductor material doped with n-type impurities. The n-type impurities may include silicon, germanium, selenium, tellurium, and carbon, and the semiconductor material may include indium nitride, gallium nitride, aluminum nitride, gallium aluminum nitride, and indium gallium nitride. However, the n-type impurities and the semiconductor material are not limited to the above-mentioned materials. Also, the p-type semiconductor layer may be formed of a semiconductor material doped with p-type impurities. The p-type impurities may include magnesium, zinc, and beryllium, and the semiconductor material may include indium nitride, gallium nitride, aluminum nitride, gallium aluminum nitride, and indium gallium nitride. However, the p-type impurities and the semiconductor material are not limited to the above-mentioned materials.

Figure 7B:
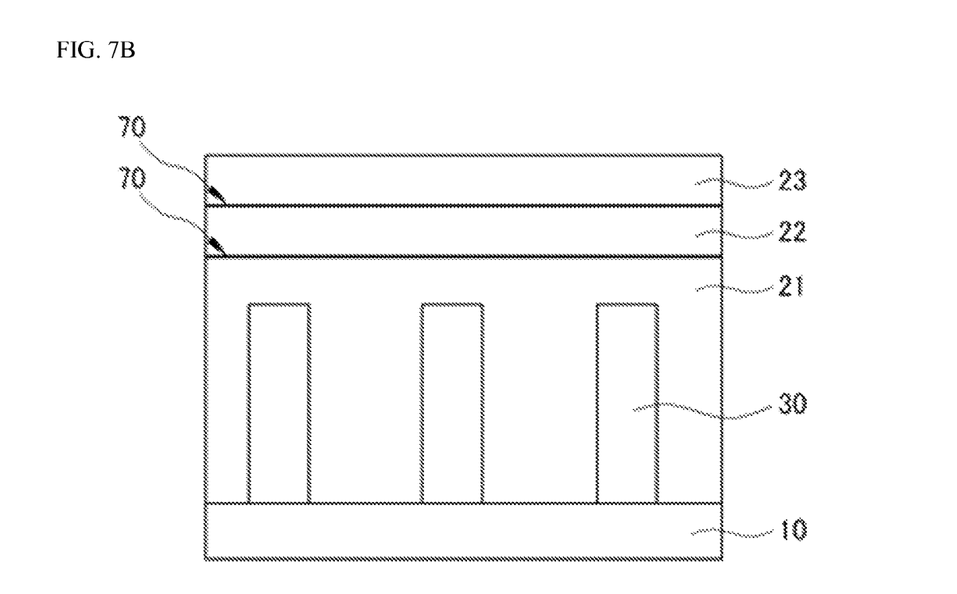
Figure 7C:
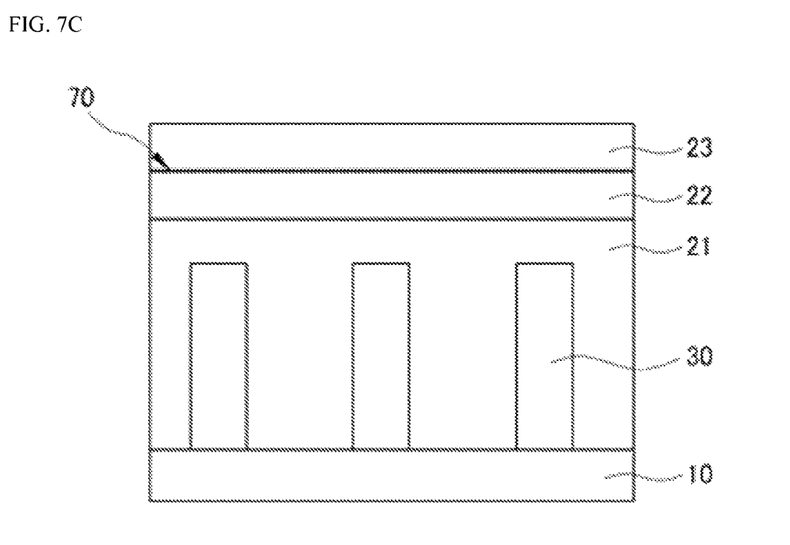
Figure 7D:
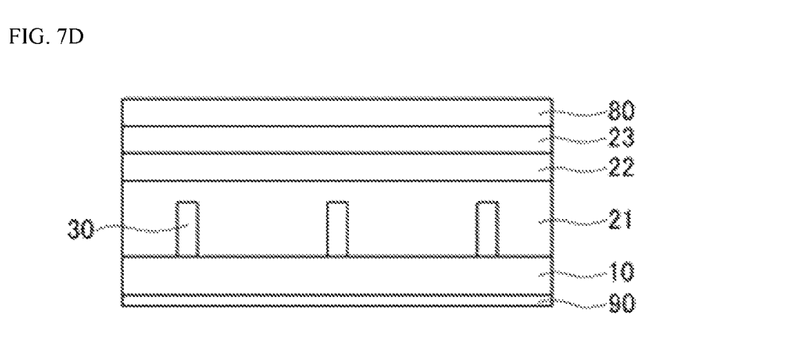

Referring to FIG. 7B, in a solar cell according to an exemplary embodiment, a plurality of thin-film layers may be formed. In this case, a plurality of charge separation junction parts is provided. Referring to FIG. 7B, the thin-film layers may include a first thin-film layer 21, a second thin-film layer 22, and a third thin-film layer 23, and the charge separation junction parts may be formed on the interfaces between the first thin-film layer 21 and the second thin-film layer 22 and between the second thin-film layer 22 and the third thin-film layer 23. As another embodiment, referring to FIG. 7C, the first thin-film layer 21 including the microstructures may not be a semiconductor layer. In this case, the second thin-film layer 22 may be an n-type or p-type semiconductor, and the third thin-film layer 23 may be a p-type or n-type semiconductor; however, the second and third thin-film layers 22 and 23 are not limited to these. Preferably, the second thin-film layer 22 is an n-type semiconductor, and the third thin-film layer 23 is a p-type semiconductor. As another exemplary embodiment of a solar cell, referring to FIG. 7D, a charge separation junction part 70 formed on the interface between microstructures 30 and a thin-film layer 21 adaptively applied on the microstructures 30. In this case, the microstructures 30 may be an n-type or p-type semiconductor, and the first thin-film layer 21 may be a p-type or n-type semiconductor. In the case in which the charge separation junction part 70 is formed on the interface between the microstructures 30 and the first thin-film layer 21, the surface area of the charge separation junction part is enlarged compared to the case in which a charge separation junction part is formed between thin-film layers, and accordingly, the efficiency of the solar cell increases.

Electrons are generated from the n-type first thin-film layer by sunlight, and the electrons move to a carbon structure layer which functions as an electrode and resides beneath the first thin-film layer. The carbon structure layer is formed of a material having less structural defects, such point defect, dislocation, stacking fault, grain boundary, etc., than a material used as the electrode of a conventional solar cell, thereby facilitating diffusion of photocharges and as a result, improving the efficiency of a solar cell.

FIG. 8 is cross-sectional views of solar cells showing the locations of a first electrode layer 80 and a second electrode layer 90. The first electrode layer and/or the second electrode layer may be formed of any conductive material that can be generally used as an electrode by one of ordinary skill in the art.

The locations of the first and/or second electrode layers 80 and 90 are not limited; however, preferably, at least one of the first and second electrode layers 80 and 90 may be connected to a carbon structure layer. However, as shown in FIG. 8D, if the carbon structure layer can itself function as an electrode, a solar cell can be manufactured using only one of the first and second electrodes 80 and 90.

Figure 8A:
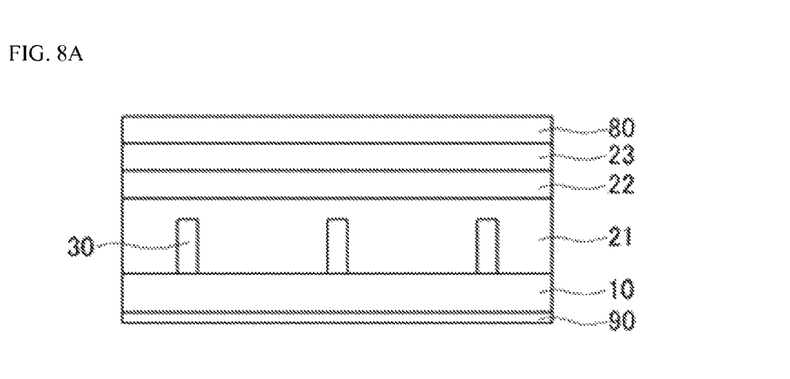
FIG. 8 is cross-sectional views of solar cells with electrodes formed at various locations, according to embodiments of the present invention.
Figure 8B:
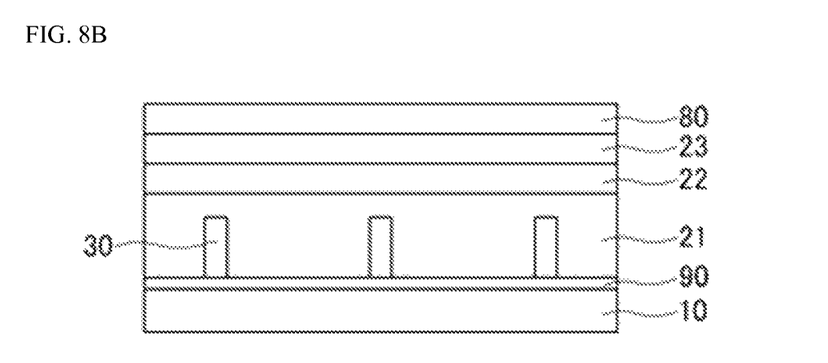

Referring to FIGS. 8A and 8B, the first electrode layer 80 is formed on a thin-film layer, and the second electrode layer 90 is formed on the upper or lower surface of a substrate 10.

Figure 8C:
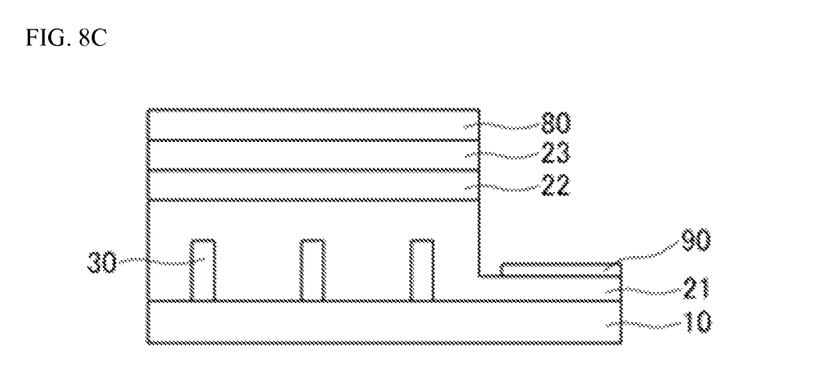
Figure 8D:
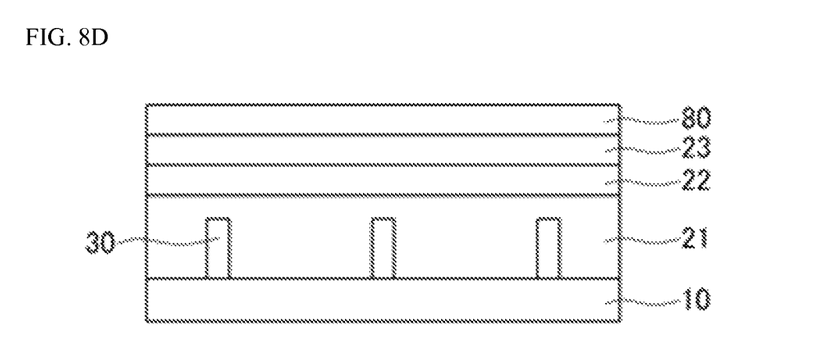

In the cases of FIGS. 8A and 8B, the second electrode layer 90 is wholly formed on one surface of the carbon structure layer 10; however, the second electrode layer 90 may be partially formed on one surface of the carbon structure layer 10. Meanwhile, all the embodiments described above relate to the cases in which the second electrode layer 90 contacts the carbon structure layer 10; however, the second electrode layer 90 may contact the thin-film layer 21 which is an n-type semiconductor layer, without contacting the carbon structure layer 10. For example, as shown in FIG. 8C, the thin-film layer 21 may be formed to have a step, and the second electrode layer 90 may be formed on an end portion on which no thin-film layer is formed.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A solar cell comprising:
   a carbon structure layer having damages;
   microstructures formed only directly on the damages of the carbon structure layer; and
   a thin-film layer covering the microstructures and comprising a charge separation junction part.

2. The solar cell of claim 1, further comprising a first electrode layer formed on the thin-film layer.

3. The solar cell of claim 1, further comprising an electrode layer formed beneath a bottom surface of the carbon structure layer or between the thin-film layer and an upper surface of the carbon structure layer.

4. The solar cell of claim 1, wherein the carbon structure layer comprises graphene or graphite.

5. The solar cell of claim 1, wherein the thin-film layer is a single layer or a plurality of layers.

6. The solar cell of claim 5, wherein the charge separation junction part is formed on an interface between the microstructures and the thin-film layer or on individual interfaces between the plurality of thin-film layers.

7. The solar cell of claim 1, wherein the microstructures are grown upward from the damages formed on the carbon structure layer.

8. The solar cell of claim 1, wherein the microstructures are selected from the group consisting of a micro-bar, a micro-needle, a micro-tube, a micro-wall, and combinations thereof.

9. The solar cell of claim 1, wherein the microstructures are formed of at least one of a metal and a semiconductor.

10. The solar cell of claim 1, wherein the thin-film layer is formed of at least one of a metal and a semiconductor.

11. The solar cell of claim 1, wherein the carbon structure layer is an electrode of the solar cell.

12. The solar cell of claim 1, further comprising a substrate below the carbon structure layer.

13. The solar cell of claim 12, wherein the carbon structure layer is formed of a material that is able to be separated from the substrate.

14. A method of manufacturing a solar cell, comprising:
preparing a carbon structure layer;
forming damages on the carbon structure layer;
growing microstructures only directly on the damages of the carbon structure layer; and
forming a thin-film layer by covering the microstructures with a thin-film forming material.

15. The method of manufacturing a solar cell of claim 14, further comprising forming a first electrode layer on the thin-film layer.

16. The method of manufacturing a solar cell of claim 14, further comprising forming an electrode layer beneath a bottom surface of the carbon structure layer or on an upper surface of the carbon structure layer before forming the thin-film layer so that the electrode layer is formed between the carbon structure layer and the thin-film layer.

17. The method of manufacturing a solar cell of claim 14, wherein the preparing of the carbon structure layer comprises forming the carbon structure layer on a substrate.

18. The method of manufacturing a solar cell of claim 17, wherein the preparing of the carbon structure layer comprises transferring the carbon structure layer formed on the substrate onto a target substrate.

19. The method of manufacturing a solar cell of claim 14, wherein the damages are formed by a method selected from the group consisting of gas plasma, ion-beam, e-beam, proton beam, neutron beam, and their combinations.

20. The method of manufacturing a solar cell of claim 14, wherein the forming of the damages comprises:
forming a mask layer on the carbon structure layer;
patterning the mask layer to form a plurality of openings; and
forming the damages on the carbon structure layer through the openings.

21. The method of manufacturing a solar cell of claim 20, wherein the patterning of the mask layer to form the plurality of openings is performed by at least one method among e-beam lithography, photolithography, laser interference lithography, nanoimprint, and template.

* * * * *